US00RE38862E

(19) United States
(12) Reissued Patent
Lemaire

(10) Patent Number: US RE38,862 E
(45) Date of Reissued Patent: Nov. 1, 2005

(54) OSCILLATOR WITH TWO OUTPUTS IN QUADRATURE

(75) Inventor: Frédéric Lemaire, Saint Egreve (FR)

(73) Assignee: STMicroelectronics S.A. (FR)

(21) Appl. No.: 10/253,574

(22) Filed: Sep. 24, 2002

Related U.S. Patent Documents

Reissue of:
(64) Patent No.: 6,124,763
Issued: Sep. 26, 2000
Appl. No.: 09/334,037
Filed: Jun. 15, 1999

(30) Foreign Application Priority Data

Jul. 8, 1998 (FR) ..... 98 08751

(51) Int. Cl.[7] ..... H03B 5/02; H03B 5/36; H03B 27/00

(52) U.S. Cl. ..... 331/45; 331/50; 331/57; 331/117 R; 331/172

(58) Field of Search ..... 331/45, 50, 57, 331/116 R, 116 FE, 117 R, 117 FE, 172, 175

(56) References Cited

U.S. PATENT DOCUMENTS 5,561,398 A 10/1996 Rasmussen ..... 331/36 C
5,561,399 A 10/1996 Haartsen ..... 331/57

FOREIGN PATENT DOCUMENTS

GB 2009547 6/1979 ..... H03C/3/22

*Primary Examiner*—David Mis
(74) *Attorney, Agent, or Firm*—Lisa K. Jorgenson; Christopher F. Regan

(57) ABSTRACT

An oscillator includes four identical cells each producing a phase shift of 90 degrees. The output signal from one cell is applied to the input of the next cell, and with the cells looping back to themselves. Each cell includes a current amplifier and a parallel inductance-capacitance resonant circuit configured such that the output current from one cell is a fraction of the capacitive current of the parallel resonant circuit. This causes the 90° phase shift between the input and output currents of each cell.

24 Claims, 2 Drawing Sheets

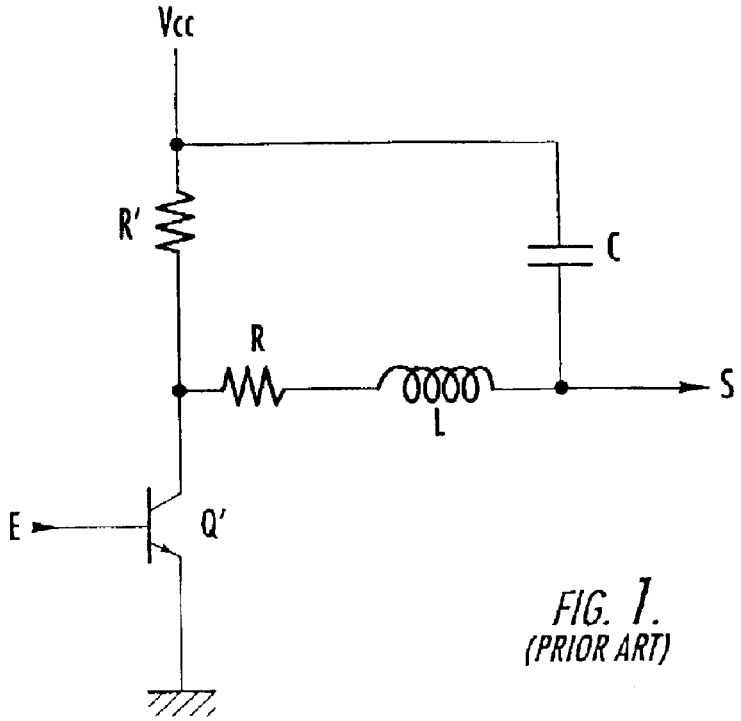
FIG. 1.
(PRIOR ART)
FIG. 2.
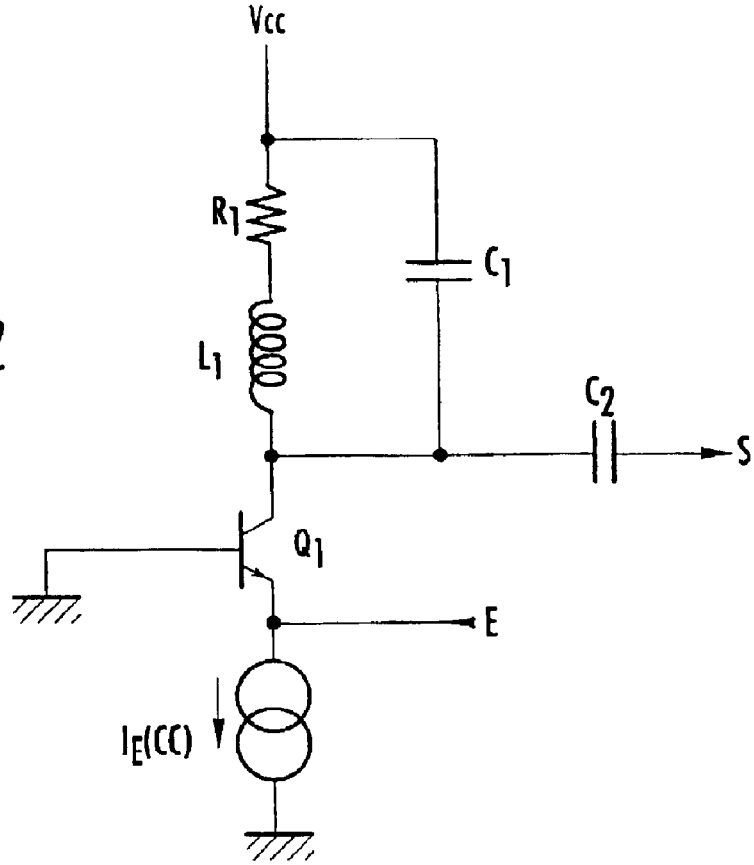

OSCILLATOR WITH TWO OUTPUTS IN QUADRATURE

Matter enclosed in heavy brackets [ ] appears in the original patent but forms no part of this reissue specification; matter printed in italics indicates the additions made by reissue.

FIELD OF THE INVENTION

The invention relates to the field of electronics, and, more particularly, to an oscillator.

BACKGROUND OF THE INVENTION

For a receiver having two frequency mixers, rejection of the image frequency is improved with an oscillator having two outputs in quadrature. The oscillator can also output signals in phase and in phase quadrature from digital receivers. The oscillator can be formed to cause a receiver to have a zero intermediate frequency. To be efficient, these receivers must have signals output by the oscillator having a phase shift of precisely 90°. Furthermore, the spectral purity of these oscillators must be very good, i.e., very low phase noise. This is obtained by a high quality of coefficient of the resonant circuit.

There are several approaches for obtaining signals in phase quadrature. Two RC circuits may be used. Once of the circuits shifts the phase of the signal output from the oscillator by +45 degrees, and the outer circuit shifts the phase of this signal by −45 degrees. The disadvantage of this approach is that, although the phase shift between the two channels is actually 90 degrees within a wide frequency range, this is not true for the amplitude of the signals which must be adjusted as a function of the operating frequency, or variations related to the values of the R and C components.

A double frequency oscillator with two outputs having a phase shift of 180 degrees may also be used when followed by a frequency divider of 2 of the "Johnson counter" type supplying two output signals with a phase shift of 90 degrees. The disadvantage of this approach is that a double frequency oscillator has to be made, and this can be very difficult to operate at high frequencies. This oscillator must have a very precise duty cycle equal to 0.5.

An oscillator with four identical looped back cells can also be used, with each cell introducing a phase shift of 90 degrees. Alternatively, two differential cells may be used to obtain a wired phase shift of 180 degrees. The precision of the phase shift between two cells in this type of oscillator is dependent only on the matching of the cells. The oscillation frequency is the frequency at which the phase shift in an open loop is 0 or 360 degrees. Since the oscillator is formed using four identical cells, the phase shift between each cell is $^{360}/_{4}$=90 degrees.

FIG. 1 shows one of the cells in an oscillator of this type according to prior art. This low pass cell is used in its differential form as disclosed in the article "1 GHz Quadrature Sinusoidal Oscillator" by Duncan et al., IEEE ClCC 95. The basic cell includes a transistor Q' installed in a common emitter configuration. The collector of the transistor Q' is connected to the DC power supply voltage $V_{cc}$ through a resistance R'.

The need to obtain low phase noise requires the use of reactive components L and C with the highest possible overvoltage coefficient Q since RC oscillators are too noisy. The basic cell shown in FIG. 1 has a gain greater than 1 and a phase shift of 90 degrees, while having a maximum overvoltage coefficient Q.

The inductance 1, and the capacitance C connected in series also connected in parallel to the collector resistance R'. The resistance R represents inductance losses L. The input E to the cell is at the base of the transistor Q'. The output S from the cell forms the common point between the inductance L and the capacitance C.

The phase shift of the cell shown in FIG. 1 at the resonant frequency, i.e., the resonant angular frequency $\omega_o$, if 90 degrees and its quality coefficient under load is $Q_c$, such that:

$$Q_c = \frac{L - \omega_0}{R + R'}$$

The above equation assumes that the transistor and capacitance are accurate.

The only way to increase the quality coefficient under load $Q_c$ for a given inductance is to reduce R'. The gain G of the cell is given by the relation:

$$G = g_m \frac{R'}{(R' + R)C\omega_0}$$

The variable $g_m$ is the transconductance of the transistor

The gain G must be greater than one to enable operation of the oscillator that includes four identical cells in cascade. The output S from one cell is connected to the input E of the next cell, and the output of the fourth cell is connected to the input of the first cell in the cascade. For example, the orders of magnitude of the value of the components may be as follows. If the inductance L is equal to 5 nH, a value of the quality coefficient of the inductance $Q_{\leqq}+L\omega_o/R=5$ is at a frequency of 2 GHz and tolerating a degradation in the quality coefficient under load of 10% ($Q_c$=0.9 Q__), then the result is:

R'=1 26 Ω

Hence, for a gain G>1, a value of the input resistance in common base rib correspondence to $1/g_m$ is equal to 5.7 Ω. This corresponds to a value of the collector current $I_c$ equal to 4.4 mA.

This relatively high value of the collector current is undesirable. Furthermore, this type of cell requires at least one follower emitter type stage so that the input impedance of the real transistor does not degrade the quality coefficient $Q_c$ Furthermore, the value obtained for the resistance R' (1.26 Ω) is not very realistic when formed in an integrated circuit. This is because the value is close to the values of the parasite resistances of the circuit.

SUMMARY OF THE INVENTION

To overcome the above described problems, the present invention provides an oscillator including four identical cells producing a phase shift of 90 degrees. The output signal from one cell is applied to the input of the next cell with [each cell looping back to itself] *an output of a last cell looping back to an input of a first cell.* Each cell includes a current amplifier and a parallel inductance-capacitance resonant circuit such that the output current from one cell is a fraction of the capacitance current of the parallel resonant circuit for creating the 90° phase shift between the respective cell input and output currents. The current amplifier may be a circuit with a low input impedance and a high output impedance. The current amplifier may be a transistor mounted in a common base configuration, and with the parallel resonant circuit connected to a collector of the transistor.

The coupling between one cell and the next cell may be capacitive, or it could be inductive. If it is inductive, it may be made using a connecting inductance or through the secondary of a transformer. The primary of the transformer forms the inductance of the resonant circuit.

BRIEF DESCRIPTION OF THE DRAWINGS

The invention will be better understood and other advantages and features will become apparent when reading the following description given as a non-restrictive example, with reference to the attached figures in which:

FIG. 1 is a block diagram of one of the four identical cells of an oscillator, according to the prior art;

FIG. 2 is a block diagram of one of the four identical cells of a first oscillator according to the present invention;

DETAILED DESCRIPTION OF THE PREFERRED EMBODIMENTS

FIG. 2 shows the basic cell of a first oscillator according to the present invention. The cell has an input receiving an input current and an output providing an output current. The output S is loaded by the input E of the next cell, which has a low impedance since it is a cell mounted in a common base configuration. The reference $I_E$(cc) represents the emitter DC current.

The resonant circuit includes an inductance $L_1$ in parallel with a capacitance $C_1$. The resistance $R_2$ represents the losses from inductance $L_1$. The capacitance $C_2$ forms the AC link with the next cell. At the resonant frequency corresponding to $\omega_o^2=1/L_1[C_1+C_2]$, the phase shift between the current input at E and the current output at S is 90 degrees. The quality coefficient under load is:

$$Q_c = \frac{L\omega_0}{R_1 + r_{ib}\left(\frac{C_2}{C_1 + C_2}\right)^2}$$

The variable $r_{ib}$ is the input resistance of transistor $Q_1$ in a common base configuration, and the transistor and capacitors $C_1$ and $C_2$ are assumed to be stable. The only way to increase the quality coefficient $Q_c$ for a given inductance is to reduce $r_{ib}$.

The oscillation condition for the gain (output current/input current) to be greater than 1 in an open loop requires the following for an ideal transistor:

$$Q_1 > \frac{Q_5 \frac{C_2}{C_2 + C_1}}{Q_5 \frac{C_2}{C_2 + C_1} - 1}$$

where $$Q_5 = \frac{L_1\omega_0}{R_1}$$

$$Q_2 = \frac{1}{r_{ib}C_2\omega_0}$$

Using the same numeric values as for FIG. 1, in other words:

$Q_c$=0.9 $Q_5$, $L_1$=5 nH, $Q_1$=5 at an oscillation frequency of 2 GHz, he oscillation condition then provides:

$$\frac{C_2}{C_1 + C_2} = 0.22$$

The resistance $R_{ib}$ is then equal to 29 Ω, which corresponds to a collector current $I_c$ equal to 0.9 mA The gain in consumed power (current $I_c$) is increased by a factor of 4.9 for the same conditions of the quality coefficient $Q_c$. Unlike the cell according to prior art shown in FIG. 1 which requires an additional follower emitter type stage, the cell in the oscillator according to the present invention can be used directly with a transistor.

Figure 3:
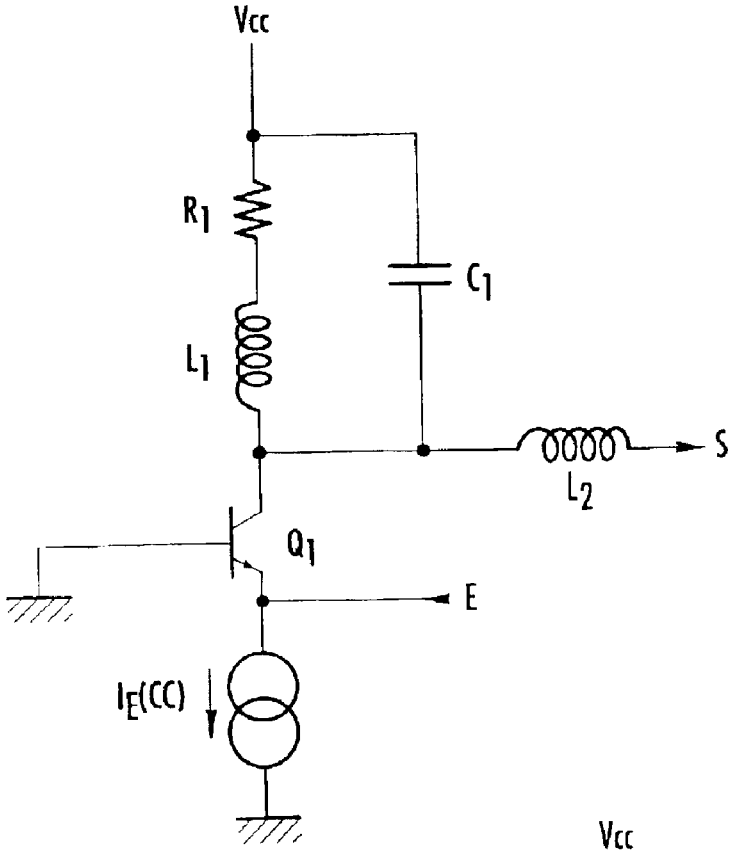
FIG. 3 is a block diagram of one of the four cells of a second oscillator according to the present invention.

FIG. 3 shows the basic cell of a second oscillator according to the invention. Unlike the cell shown in FIG. 2, the coupling between two consecutive cells is inductive, and is made through a connecting inductance $L_2$ and through a capacitor with a high capacitance (not shown) to prevent DC current from passing.

Figure 4:
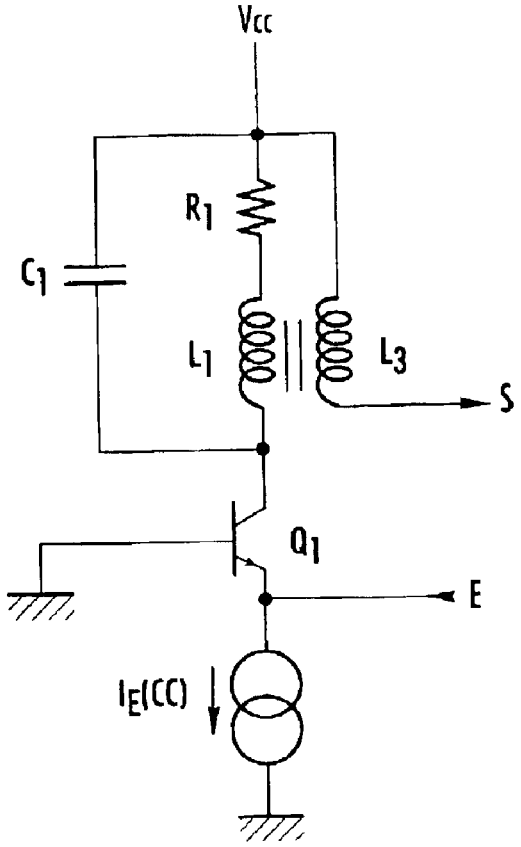
FIG. 4 is a block diagram of one of the four identical cells of a third oscillator according to the present invention.

For the cell shown in FIG. 4, coupling between two consecutive cells is also indicative. The coupling is achieved through the secondary $L_3$ of a transformer. The primary of the transformer forms the inductance $L_1$ of the parallel resonant circuit. As before, a capacitor with a high capacitance (not shown) prevents DC current from passing.

Therefore, the present invention can be used to make an oscillator in quadrature with good phase noise quality. It is easy to make and its power consumption is considerably less than that of an oscillator made according to the prior art That which is claimed is:

1. A quadrature oscillator comprising:

four cells coupled together, each cell producing a phase shift of 90 degrees between an output current and an input current, the output current being applied as an input current to an adjacent cell, and an output of [each cell looping back to its input] *a last cell looping back to an input of a first cell*, each cell comprising a current amplifier, and a resonant circuit connected to said current amplifier such that the output current from each cell is substantially less than a capacitive current of said resonant circuit providing the 90° phase shift between the input and output currents.

2. A quadrature oscillator according to claim 1, wherein said resonant circuit comprises a parallel inductance-capacitance resonant circuit.

3. A quadrature oscillator according to claim 1, wherein said current amplifier comprises a transistor in a common-base configuration; and wherein said resonant circuit is connected to a collector of said transistor.

4. A quadrature oscillator according to claim 1, further comprising a capacitive element connected between adjacent cells.

5. A quadrature oscillator according to claim 1, further comprising an inductive element connected between adjacent cells.

6. A quadrature oscillator according to claim 5, wherein said inductive element comprises a transformer having a secondary winding defining said inductive element, and having a primary winding defining an inductive portion of said resonant circuit.

7. A quadrature oscillator comprising:

four cells coupled together, each cell producing a phase shift of 90 degrees between an output current and an input current, the output current being applied as an input current to an adjacent cell, and an output of [each cell looping back to its input] *a last cell looping back to an input of a first cell*, each cell comprising a transistor in a common-base configuration, and a resonant circuit connected to a collector of said transistor such that the output current from each cell is substantially less than a capacitive current of said resonant circuit providing the 90° phase shift between the input and output currents.

8. A quadrature oscillator according to claim 7, wherein said resonant circuit comprises a parallel inductance-capacitance resonant circuit.

9. A quadrature oscillator according to claim 7, further comprising a capacitive element connected between adjacent cells.

10. A quadrature oscillator according to claim 7, further comprising an inductive element connected between adjacent cells.

11. A quadrature oscillator according to claim 7, wherein said inductive element comprises a transformer having a secondary winding defining said inductive element, and having a primary winding defining an inductive portion of said resonant circuit.

12. A quadrature oscillator comprising:

four cells coupled together, each cell producing a phase shift of 90 degrees between an output current and an input current, the output current being applied as an input current to an adjacent cell, and an output of [each cell looping back to its input] *a last cell looping back to an input of a first cell*, each cell comprising a current amplifier and a resonant circuit connected thereto.

13. A quadrature oscillator according to claim 12, wherein said current amplifier comprises a transistor in a common-base configuration; and wherein said resonant circuit is connected to a collector of said transistor.

14. A quadrature oscillator according to claim 12, wherein said resonant circuit has an output providing the 90° phase shift between the input and output currents; and wherein the output current from each ell is substantially less than a capacitive current of said resonant circuit.

15. A quadrative oscillator according to claim 12, wherein said resonant circuit comprises a parallel inductance-capacitance resonant circuit.

16. A quadrature oscillator according to claim 12, further comprising a capacitive element connected between adjacent cells.

17. A quadrature oscillator according to claim 12, further comprising an inductive element connected between adjacent cells.

18. A quadrature oscillator according to claim 12, wherein said inductive element comprises a transformer having a secondary winding defining said inductive element, and having a primary winding defining an inductive portion of said resonant circuit.

19. A method of making a quadrature oscillator comprising the steps of:

coupling four cells together such that the output current of one cell is applied as the input current to an adjacent cell, and an output of [each cell looping back to its input] *a last cell looping back to an input of a first cell*, each cell comprising a current amplifier and is resonant circuit connected thereto such that the output current from each cell is substantially less than a capacitive current of the resonant circuit providing a 90° phase shift between the input and output currents.

20. A method according to claim 19, wherein said resonant circuit comprises a parallel inductance-capacitance resonant circuit.

21. A method according to claim 19, wherein said current amplifier comprises a transistor in a common-base configuration, and wherein the method further comprises the step of connecting the resonant circuit to a collector of the transistor.

22. A method according to claim 19, further comprising the step of connecting adjacent cells together using a capacitive element.

23. A method according to claim 19, further comprising the step of connecting adjacent cells together using an inductive element.

24. A method according to claim 23, wherein the inductive device comprises a transformer having a secondary winding defining the inductive element, and having a primary winding defining an inductive portion of the resonant circuit.

* * * * *